United States Patent
Singh et al.

(10) Patent No.: US 7,652,535 B2
(45) Date of Patent: Jan. 26, 2010

(54) CONTINUOUS TIME COMMON MODE FEEDBACK CIRCUIT, SYSTEM, AND METHOD

(75) Inventors: Pratap N Singh, Varanasi (IN); Chandrajit Debnath, Greater Noida (IN); Rakesh Malik, Noida (IN); Ashish Kumar Sharma, Ghaziabad (IN)

(73) Assignee: STMicroelectronics Pvt. Ltd., Greater Noids, Uttar Pradesh (IN)

( * ) Notice: Subject to any disclaimer, the term of this patent is extended or adjusted under 35 U.S.C. 154(b) by 0 days.

(21) Appl. No.: 11/900,929

(22) Filed: Sep. 12, 2007

(65) Prior Publication Data
US 2008/0068083 A1 Mar. 20, 2008

(30) Foreign Application Priority Data
Sep. 13, 2006 (IN) .................. 2025/DEL/2006

(51) Int. Cl.
H03F 3/45 (2006.01)
(52) U.S. Cl. ...................................... 330/258
(58) Field of Classification Search .................. 330/258, 330/259
See application file for complete search history.

(56) References Cited

U.S. PATENT DOCUMENTS

| | | | |
|---|---|---|---|
| 4,573,020 A | 2/1986 | Whatley | |
| 5,039,954 A | 8/1991 | Bult et al. | |
| 5,748,040 A | 5/1998 | Leung | |
| 5,764,101 A * | 6/1998 | Archer | 330/253 |
| 6,114,907 A | 9/2000 | Sakurai | |
| 6,177,838 B1 | 1/2001 | Chiu | |
| 6,353,361 B1 | 3/2002 | Sun | |
| 6,362,688 B1 | 3/2002 | Au | |
| 6,411,165 B1 * | 6/2002 | Delano | 330/258 |
| 6,529,070 B1 | 3/2003 | Nagaraj | |
| 6,985,038 B2 * | 1/2006 | Miwa et al. | 330/258 |

OTHER PUBLICATIONS

Siliconix AN105, "FETs as Voltage-Controlled Resistors," Mar. 10, 1997, pp. 1-6.
Bult, K., Geelen, G., "A fast-settling CMOS operational amplifier for SC circuits with 90-db dc gain," IEEE Journal of Solid State Circuits, Dec. 1990, pp. 1379-1394,vol. 25, No. 6.
Gray, Paul. R., et al., "Neutralization", Analysis and Design of Analog Integrated Circuits, Feb. 14, 2001, pp. 849-850, 4th Ed.
Ahmadi, M. M., "A New Modeling and Optimization of Gain-Boosting Amplifier for High-Speed and Low-Voltage Applications", IEEE Transaction on Circuits and Systems II, Mar. 2006, pp. 169-173, vol. 53, Issue 3.

* cited by examiner

*Primary Examiner*—Robert Pascal
*Assistant Examiner*—Khiem D Nguyen
(74) *Attorney, Agent, or Firm*—Lisa K. Jorgenson; Paul F. Rusyn; Graybeal Jackson LLP (57) ABSTRACT

Embodiments of the present invention provide a low voltage continuous time common mode feedback (CMFB) module, for low voltage operational amplifiers, providing good linearity, wide bandwidth and low systematic offset. The common mode feedback module includes a controlling module and an initializing module. The controlling module and the initializing module are parallel common mode feedback loops. The controlling module is a main CMFB loop and the initializing module is an auxiliary CMFB loop and both the loops work simultaneously. The controlling module and the initializing module receive a first differential input voltage and a second differential input voltage supplied by differential outputs of a main differential amplifier. Both the CMFB loops are low gain amplifiers in order to provide operation as linear as possible over the entire differential output operating range of the main differential amplifier.

14 Claims, 6 Drawing Sheets

FIG. 6

CONTINUOUS TIME COMMON MODE FEEDBACK CIRCUIT, SYSTEM, AND METHOD

PRIORITY CLAIM

The present application claims the benefit of Indian Patent Application No. 2025/Del/2006, filed Sep. 13, 2006, which application is incorporated herein by reference in its entirety.

TECHNICAL FIELD

Embodiments of the present invention relate to common mode feedback circuits and more specifically to a low voltage continuous time common mode feedback circuit, for low voltage operational amplifiers, providing a good linearity, a wide bandwidth and a low systematic offset.

BACKGROUND

The market and the need to develop efficient portable electronic equipment have pushed the industry to produce circuit designs with very low voltage (LV) power supply and also often constrained to low power (LP) consumption. The basic problem with using conventional analog differential and/or operational amplifiers in fine-line CMOS technology is that the threshold voltage and drain source saturation voltage do not scale down at the same rate as the supply voltage.

An operational amplifier, the most omnipresent analog system building block, has had to adapt in order to function in today's low voltage, high noise environment. Therefore, fully differential design principles have been applied to the operational amplifiers.

However, when a differential amplifier is in a feedback configuration, a high differential gain of a fully differential amplifier stabilizes differential-mode signals within the amplifier, but common-mode signals can float. Extra circuitry, called a common mode feedback (CMFB) circuit, is required to increase a common mode loop gain of the amplifier so that the common-mode signals are stabilized. The CMFB circuit implements a negative feedback loop that must be compensated properly to minimize loop settling time and to maintain stability. Often, designing the CMFB circuit is more challenging than the actual operational amplifier's design due to the difficulty in properly compensating the CMFB circuit.

The CMFB circuit averages both differential output voltages to produce a common mode voltage VCM. The voltage VCM is then compared to a desired reference common-mode voltage VCMR. A difference between VCM and VCMR is amplified and this error voltage is used to change the common mode bias current. If the common-mode voltage VCM is continuously compared with a constant reference voltage VCMR, then the common mode feedback circuit is referred as a continuous time common mode feedback circuit.

Figure 1:
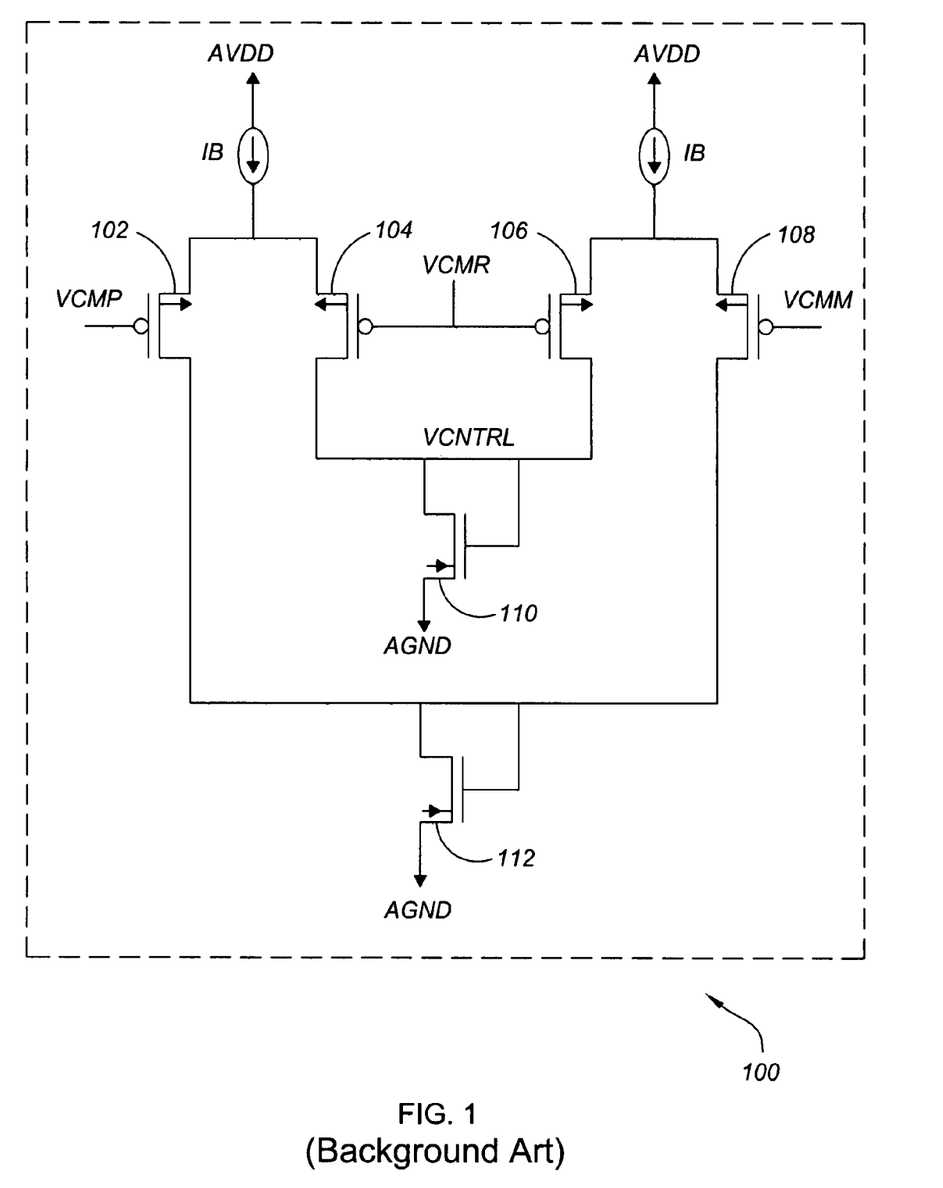
FIG. 1 illustrates a circuit diagram of a conventional common mode feed back circuit.

FIG. 1 illustrates a conventional continuous time common mode feedback circuit 100. The circuit 100 includes four identical transistors 102, 104, 106, 108 and two transistors 110 and 112. The common mode feedback circuit 100 averages two differential signals VCMP and VCMM that are supplied by differential outputs OUTP and OUTM of a main differential amplifier (not shown) and compares the average to the reference common mode voltage VCMR by using the four identical transistors 102, 104, 106 and 108 configured into two differential pairs.

Currents through the transistors 102, 104, 106 and 108 are given by the following equations:

$$IDP0 = IB/2 - \Delta I;$$

$$IDP1 = IB/2 + \Delta I;$$

$$IDP2 = IB/2 - \Delta I;$$

$$IDP3 = IB/2 + \Delta I;$$

Where IDP0 is the current through the transistor 102, IDP1 is the current through the transistor 104, IDP2 is the current through the transistor 106, IDP3 is the current through the transistor 108 and IB is the current flowing to the transistors 102, 104, 106 and 108.

The current IDP0 equals IDP2 and IDP1 equals IDP3. Currents through the transistors 110 and 112 are equal to IB. Now if the differential signals VCMP and VCMM are averaged with VCM which is greater than VCMR, currents through the transistors 102 and 108, IDP0 and IDP3 will decrease causing currents IDP1 and IDP2 through transistors 104 and 106 to increase. The increased current in the diode connected transistor 110 causes a voltage VCNTRL to increase. The increase in the voltage VCNTRL is applied to the gate of the transistors which are part of the operational amplifier output stage current sink (not shown). The current being sunk into the drain of those transistors will increase, causing a reduction in the voltage of nodes VCMP and VCMM, thus reducing the common mode output voltage VCM. The same analysis can be used to describe the behavior of the CMFB circuit when the differential signals VCMP and VCMM are averaged with VCM smaller than VCMR.

However, this conventional method cannot be used in low voltage power supply environment without severely limiting an output voltage swing (VCMP-VCMM) of the operational amplifier and the non-linear behavior of the differential pairs of the circuit 100.

Some other conventional common mode feedback schemes are also used. In one method, the common mode voltage VCM is periodically refreshed to the common mode reference voltage VCMR. This circuit is well suited for low voltage applications to increase the output voltage swing. However, as the circuit is based on switched capacitor technique, additional switching noise is introduced to output signals.

Another conventional common mode feedback scheme is designed with resistors. The amplifiers have problems of resistor tolerances and the large value resistors degrade the performance of the amplifiers by limiting the voltage swing, thereby forcing operation at higher supply voltages where the limited voltage swing is not a disadvantage.

Therefore, there is a need of a novel continuous time common mode feedback circuit for low voltage operational amplifiers for providing a good linearity, a wide bandwidth and a low systematic offset.

SUMMARY

Embodiments of the present invention provide low voltage continuous time common mode feedback modules, for low voltage operational amplifiers, having good linearity, a wide bandwidth and a low systematic offset.

One embodiment of the present invention is a low voltage continuous time common mode feedback module including an initializing module receiving a first differential input voltage (VCMP) and a second differential input voltage (VCMM) for providing a direct current (DC) bias, and a controlling module receiving the first differential input voltage (VCMP) and the second differential input voltage (VCMM) for controlling a common mode voltage.

Another embodiment of the present invention is an operational amplifier including one or more differential amplifier stages for generating differential output voltages, and a low voltage continuous time common mode feedback module operatively coupled to the one or more differential amplifier stages for receiving a first differential input voltage (VCMP) and a second differential input voltage (VCMM) to provide a common mode feedback voltage.

Another embodiment of the present invention is a method for generating a common mode control voltage in a low voltage continuous time common mode feedback module including initializing a controlling module and an initializing module by a supply voltage and a ground voltage, applying a first differential voltage at a bulk terminal of a second transistor and at a gate terminal of an eighth transistor, applying a second differential voltage at a bulk terminal of a third transistor and at a gate terminal of a ninth transistor, applying a common mode reference voltage at a bulk terminal of a fourth transistor and at a gate terminal of a tenth transistor, applying a bias current at gate terminals of a first transistor and a seventh transistor, applying an input terminal voltage at gate terminals of said second transistor, said third transistor and said fourth transistor, and generating the common mode control voltage.

BRIEF DESCRIPTION OF THE DRAWINGS

The aforementioned aspects and other features of the present invention will be explained in the following description, taken in conjunction with the accompanying drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 2:
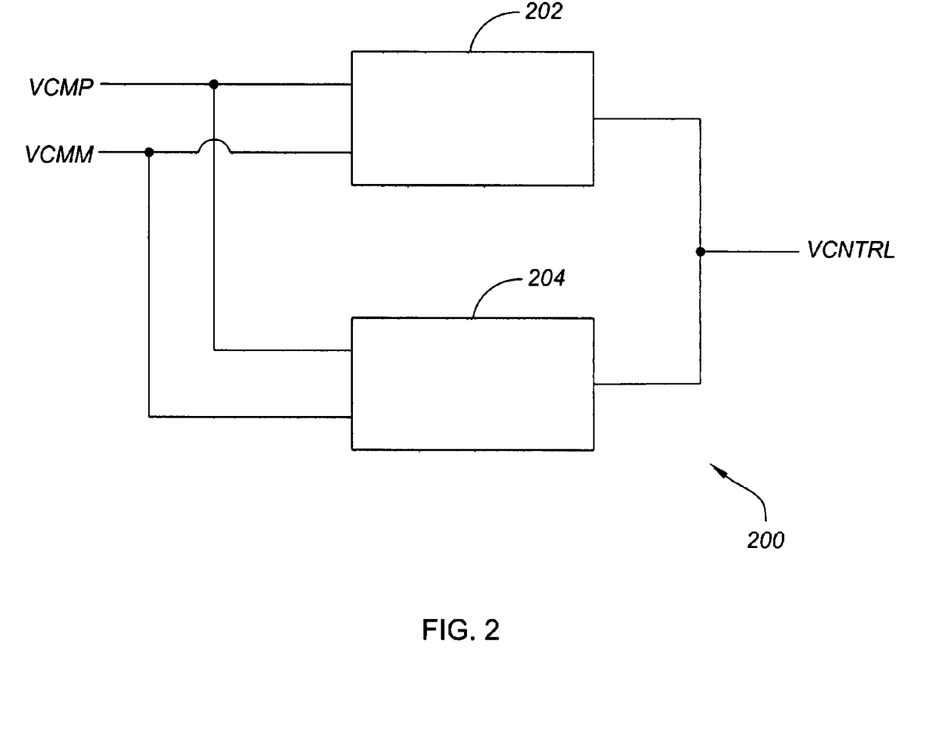
FIG. 2 illustrates a block diagram of a common mode feedback module according to an embodiment of the present invention.

FIG. 2 illustrates a block diagram of a low voltage continuous time common mode feed back (CMFB) module 200 according to an embodiment of the present invention. The common mode feedback module 200 includes a controlling module 202 and an initializing module 204. The controlling module 202 and the initializing module 204 receive a first differential input voltage VCMP and a second differential input voltage VCMM for generating a common mode control voltage VCNTRL.

Figure 3:
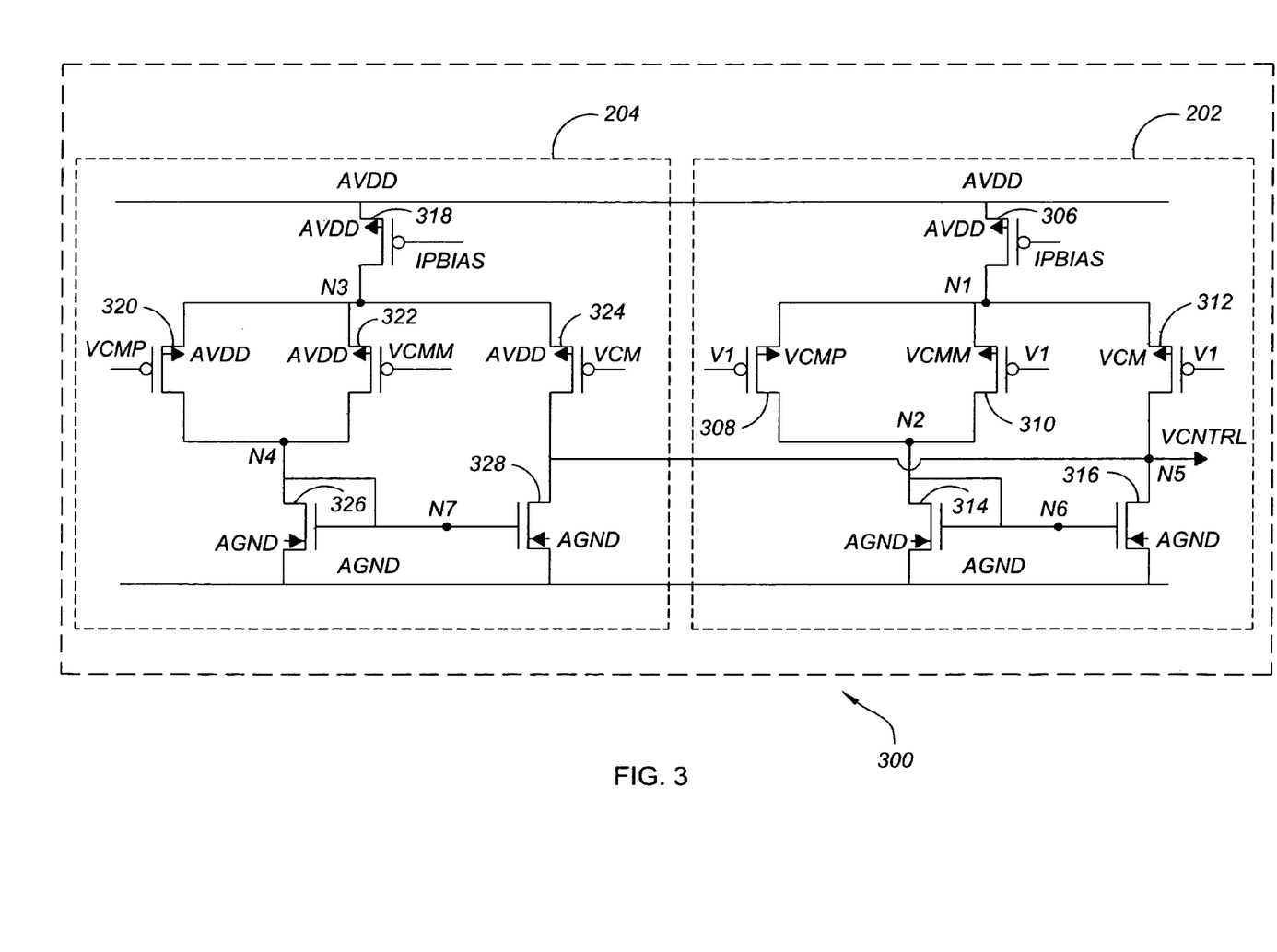
FIG. 3 illustrates a circuit diagram of a common mode feed back module according to an embodiment of the present invention.

FIG. 3 illustrates a circuit diagram of a low voltage continuous time common mode feed back (CMFB) module 300 according to an embodiment of the present invention. The CMFB module 300 includes a common mode detector and an amplifier for computing and amplifying a difference of a common mode reference voltage VCM and a common mode voltage of inputs VCMP and VCMM.

The CMFB module 300 includes a controlling module 202 and an initializing module 204. The controlling module 202 and the initializing module 204 are parallel CMFB loops. The controlling module 202 is a main CMFB loop and the initializing module 204 is an auxiliary CMFB loop. Both loops work at the same time. The controlling module 202 and the initializing module 204 receive a first differential input voltage VCMP, a second differential input voltage VCMM, supplied by differential outputs OUTP and OUTM of a main differential amplifier (illustrated in FIG. 5). Both CMFB amplifiers 202 and 204 are low gain amplifiers in order to provide operation as linear as possible over the entire differential output operating range, OUTP to OUTM, of the main differential amplifier.

The controlling module 202 includes a first transistor 306, a second transistor 308, a third transistor 310, a fourth transistor 312, a fifth transistor 314 and a sixth transistor 316.

The first transistor 306 provides a bias current IPBIAS to the controlling module 202. A source terminal and a bulk terminal of the first transistor 306 are connected to a supply voltage AVDD, a drain terminal is connected to a first node N1 and a gate terminal receives the bias current IPBIAS. The second transistor 308 receives the first differential input voltage VCMP. The second transistor 308 has a source terminal connected to the first node N1, a bulk terminal receiving the first differential input voltage VCMP, a drain terminal connected to a second node N2 and a gate terminal connected to an input terminal voltage V1. The third transistor 310 has a source terminal connected to the first node N1, a bulk terminal receiving the second differential input voltage VCMM, a drain terminal connected to the second node N2 and a gate terminal connected to the input terminal voltage V1. The fourth transistor 312 has a source terminal connected to the first node N1, a bulk terminal receiving the common mode reference voltage VCM, a drain terminal connected to an output node N5 and a gate terminal connected to the input terminal voltage V1. The fifth transistor 314 controls a flow of current through the second transistor 308 and the third transistor 310. A source terminal and a bulk terminal of the fifth transistor 314 is connected to a ground voltage AGND, a drain terminal is connected to the second node N2 and a gate terminal is connected to the drain terminal and to a sixth node N6. The sixth transistor 316 provides a common mode control voltage VCNTRL. A source terminal and a bulk terminal of the sixth transistor 316 are connected to the ground voltage AGND, a drain terminal is connected to the output node N5, a gate terminal is connected to the gate terminal of the fifth transistor 314 through the sixth node N6.

The initializing module 204 includes a seventh transistor 318, an eighth transistor 320, a ninth transistor 322, a tenth transistor 324, an eleventh transistor 326 and a twelfth transistor 328.

The seventh transistor 318 provides the bias current IPBIAS to the initializing module 204. The seventh transistor 318 has a source terminal and a bulk terminal connected to the supply voltage AVDD, a drain terminal connected to a third node N3 and a gate terminal receiving the bias current IPBIAS. The eighth transistor 320 has a source terminal connected to the third node N3, a bulk terminal connected to the supply voltage AVDD, a drain terminal connected to a fourth node N4 and a gate terminal receives the first differential input voltage VCMP. The ninth transistor 322 has a source terminal connected to the third node N3, a bulk terminal connected to the supply voltage AVDD, a drain terminal connected to the fourth node N4 and a gate terminal receives the second differential input voltage VCMM. The tenth transistor 324 has a source terminal connected to the third node N3, a bulk terminal connected to the supply voltage AVDD, a drain terminal connected to the output node N5 and a gate terminal receives the common mode reference voltage VCM. The eleventh transistor 326 controls a flow of current through the eighth transistor 320 and ninth transistor 322. A source terminal and a bulk terminal of the eleventh transistor 326 is connected to the ground voltage AGND, a drain terminal is connected to the fourth node N4 and a gate terminal is connected to the drain terminal and to a seventh node N7. The twelfth transistor 328 provides the common mode control voltage VCNTRL, having a source terminal and a bulk terminal connected to the ground voltage AGND, a drain terminal connected to the output node N5 and a gate terminal connected to the gate terminal of the eleventh transistor 326 through the seventh node N7.

Thus, the differential inputs VCMP, VCMM of the controlling module 202 are shorted to the differential inputs VCMP, VCMM of the initializing module 204. An output VCNTRL of the controlling module 202 is shorted to an output VCNTRL of the initializing module 204.

Figure 4:
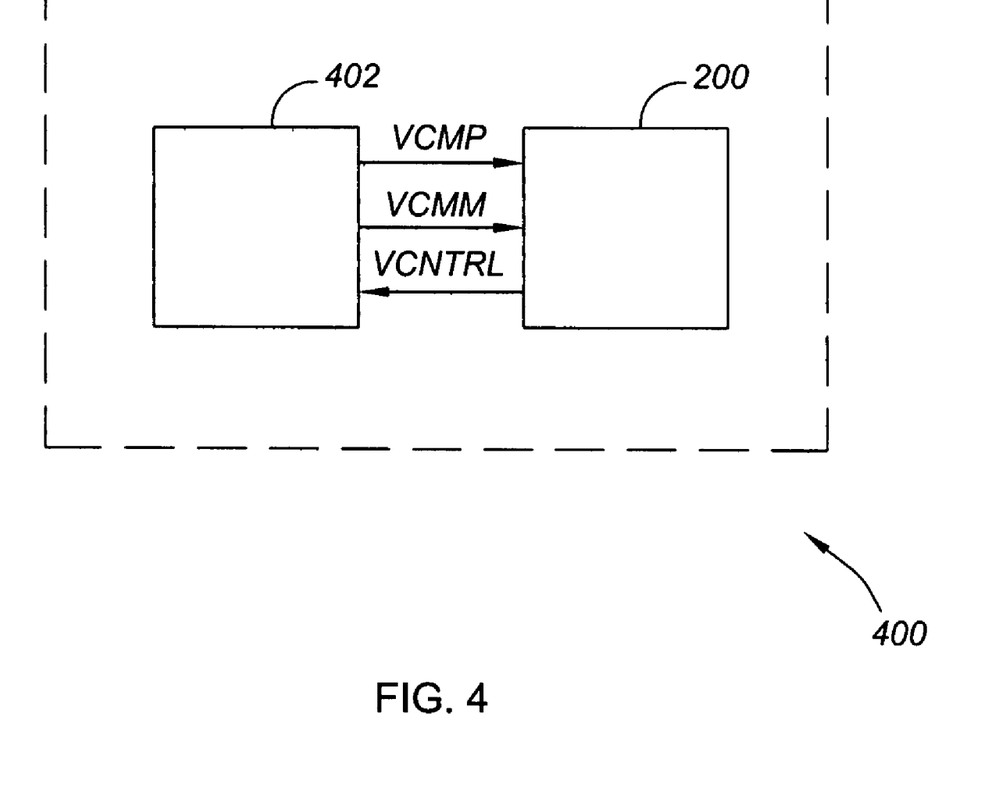
FIG. 4 illustrates a block diagram of an operational amplifier according to an embodiment of the present invention.

FIG. 4 illustrates a block diagram an operational amplifier (OPAMP) utilizing a low voltage continuous time common mode feedback module according to an embodiment of the present invention. The operational amplifier 400 includes one or more stages of differential amplifier 402 and a common-mode feedback module 200. The one or more stages of differential amplifier 402 are generating differential output voltages. The common-mode feedback module 200 is connected to the one or more stages of differential amplifier 402 to receive a first differential input voltage VCMP and a second differential input voltage VCMM for providing a common mode control voltage VCNTRL.

Figure 5:
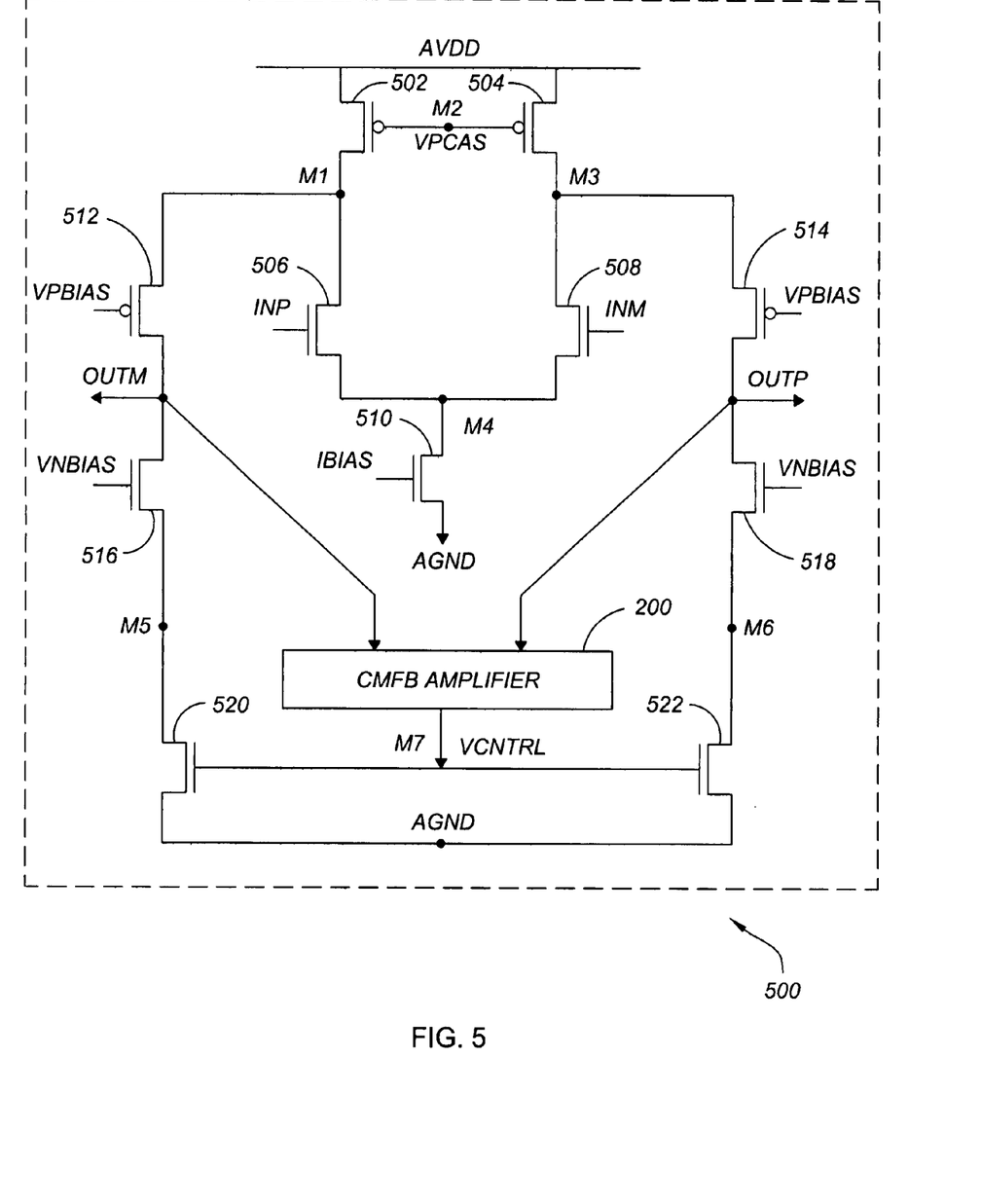
FIG. 5 illustrates a schematic circuit diagram of an operational amplifier according to an embodiment of the present invention.

FIG. 5 illustrates a schematic circuit diagram of an operational amplifier 500 according to an embodiment of the present invention. The operational amplifier 500 can be a folded cascode operational amplifier device.

The operational amplifier 500 includes a first active element 502, a second active element 504, a third active element 506, a fourth active element 508, a fifth active element 510, a sixth active element 512, a seventh active element 514, an eighth active element 516, a ninth active element 518, a tenth active element 520, an eleventh active element 522 and a continuous time common mode feed back (CMFB) module 200.

The first active element 502, receiving a voltage VPCAS, has a source terminal connected to the supply voltage AVDD, a drain terminal connected to a first port M1 and a gate terminal connected to a gate terminal connected to a second port M2. The second active element 504 has a source terminal connected to the supply voltage AVDD, a drain terminal connected to a third port M3 and a gate terminal is connected to the gate terminal of the first active element 502 through the second port M2. The third active element 506 has a source terminal connected to a fourth port M4, a drain terminal connected to the first port M1 and a gate terminal receiving a first input signal INP. The fourth active element 508 has a source terminal connected to the fourth port M4, a drain terminal connected to the third port M3 and a gate terminal receiving a second input signal INM. A source terminal of the fifth active element 510 is connected to the ground voltage AGND, a drain terminal connected to the fourth port M4 and a gate terminal receiving a bias control signal IBIAS. The sixth active element 512 has a source terminal connected to the first port M1, a drain terminal connected to a first output port OUTM and a gate terminal receiving a positive bias voltage VPBIAS. The seventh active element 514 has a source terminal connected to the third port M3, a drain terminal connected to a second output port OUTP and a gate terminal receiving said positive bias voltage VPBIAS. The eighth active element 516 has a source terminal connected to a fifth port M5, a drain terminal connected to the first output port OUTM and a gate terminal receiving a negative bias voltage VNBIAS. The ninth active element 518 has a source terminal connected to a sixth port M6, a drain terminal connected to the second output port OUTP and a gate terminal receiving the negative bias voltage VNBIAS. The tenth active element 520 has a source terminal connected to the ground voltage AGND, a drain terminal connected to the source terminal of said eighth active element 516 through the fifth port M5 and a gate terminal connected to a seventh port M7. The eleventh active element 522 has a source terminal connected to the ground voltage AGND, a drain terminal connected to the source terminal of said ninth active element 518 through the sixth port M6 and a gate terminal connected to a seventh port M7. The continuous time common mode feedback module 200 is connected between the first output port OUTM, the second output port OUTP and gate terminals of the tenth active element 520 and the eleventh active element 522 through the seventh port M7.

The two active elements 506 and 508 forms a differential pair input stage. The active element 510 establishes a current into the input branch of the operational amplifier 500. The active elements 502 and 504 divert extra current into an output branch and serves as an active load for the input stage as well. The active elements 512, 514 and 516, 518 serve as load for the output branch of the operational amplifier 500.

Since the operational amplifier 500 is a fully differential operational amplifier, a common mode feedback circuit will be required to set the common mode voltage of the differential outputs. The common mode feedback module 200 is used in the operational amplifier 500 to control the common mode voltage of the operational amplifier's outputs.

In one embodiment, when the operational amplifier 500 is in a steady state condition, the CMFB module 300 will also be in a steady state condition and current through the fifth transistor 314 and the sixth transistor 316 of the controlling module 202 and through the eleventh transistor 326 and the twelfth transistor 328 of the initializing module 204 of the CMFB module 300 are matched according to their geometric ratios.

If the common mode of inputs of the CMFB module 300, i.e., (VCMP+VCMM)/2 is equal to the common mode reference voltage VCM, then the common mode control voltage VCNTRL will be such that it mirrors currents through the twelfth transistor 328 of the initializing module 204 to the tenth active element 520 and the eleventh active element 522 of the operational amplifier 500 in their geometric ratios to force common mode of outputs of the operational amplifier 500, i.e., (OUTP+OUTM)/2 will be equal to the VCM. The fifth transistor 314 and the sixth transistor 316 of the controlling module 202 and the eleventh transistor 326 and the twelfth transistor 328 of the initializing module 204 have geometric ratio 2:1. The transistors 308, 310, 312 of the controlling module 202 have equal geometric ratios and the transistors 320, 322, 324 of the initializing module 204 also have equal geometric ratios. Due to their geometric ratios the current through the transistor 314 of the controlling module 202 and through the transistor 326 of the initializing module 204 will be 2I. The currents through the transistors 316 of the controlling module 202 and 328 of the initializing module 204 will be I. So the transistors 306 of the controlling module 202 and 318 of the initializing module 204 will be biased such that the current through them is 3I. So in a steady state condition, current through the transistors 308, 310, 312, 320, 322 and 324 will be I.

Currents through the transistors 306 and 318 have no dependency on the differential input voltages VCMP, VCMM.

If the common mode input voltage of the CMFB module 300, i.e., (VCMP+VCMM)/2 is not equal to VCM, then the current through the transistors 316 and 328 will be different from the current through the transistors 314 and 326 respectively.

This change in current is due to the variation in a threshold voltage with the common mode voltage. The threshold voltage reduces for a forward biasing of a bulk-source junction. Therefore, the common mode control voltage VCNTRL changes according to the currents in the transistors 316, 328, 314 and 326 that correct the output common mode voltage of the main differential amplifier 500. The sixth transistor 316 and the twelfth transistor 328 serves as active load for producing the common mode control voltage VCNTRL by sinking and sourcing extra currents, so as to perform common mode feedback operation.

If the common mode voltage of the input terminals of 300 is greater than VCM, then the current through the transistors 308 and 310 is decreased due to more reverse biasing of the source-bulk junction and the current through the transistors 320 and 322 is decreased due to the reduced gate to source voltages for these transistors. Due to the reduction in the currents through the transistors 308, 310, 320 and 322, current through the transistors 312 and 324 is increased and as a result the output voltage VCNTRL of 300 increases. This increased voltage which is mirrored to the main differential amplifier 500 through the active elements 520 and 522 increases the current through the active elements 520 and 522 and thereby the output node voltages (common mode voltage) of the main differential amplifier 500 are decreased. Similarly, a decrease in the common mode voltage is restored by the CMFB module 300.

For the system to work properly, the bulk driven the controlling module 202 should not have any forward bias junction (drain-bulk or source-bulk). If the source-bulk junction of transistors 308 and 310 are not forward biased, then the drain-bulk junction will also not be forward biased because the drain terminal voltages of these transistors will be lower than their source terminal voltages. To ensure this, the first differential input voltage VCMP and the second differential input voltage VCMM should not go lower than the input terminal voltage V1 of the CMFB module 300.

If the common mode voltage of the operational amplifier 500 goes near to the ground voltage, then the source bulk junction will be forward bias and there will be no control on a gmb (transconductance of bulk driven MOSFETs) and the controlling module 202 will not work accordingly.

Therefore, for the proper working of the controlling module 202, an extra or auxiliary common mode feedback loop, i.e., the initializing module 204 is added to the CMFB module 300. So, when the common mode voltage of the operational amplifier 500 goes near to the ground voltage AGND, the initializing module 204 works and raises the common mode voltage to the extent from where the controlling module 202 starts working. After raising the output common mode voltage to some extent, the initializing module 204 stops working because of the swing problem. The controlling module 202 cannot work for large values of the common mode voltage. So, the CMFB module 300 can work for a large swing of the operational amplifier's outputs. The initializing module 204 is designed with a gain as low as possible to avoid any compensation.

Figure 6:
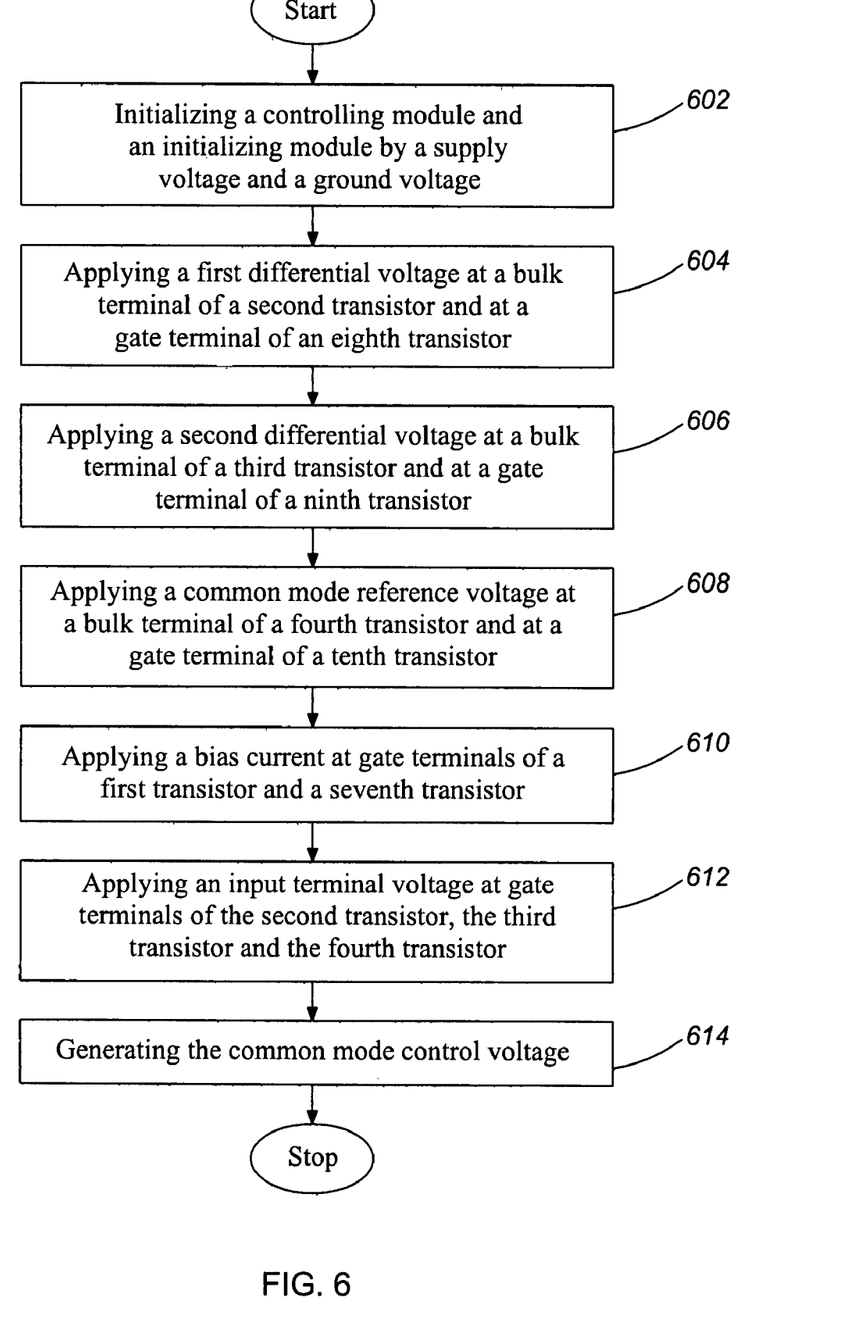
FIG. 6 illustrates a flow diagram of a method for generating a common mode control voltage according to an embodiment of the present invention.

FIG. 6 illustrates a flow diagram of a method for generating a common mode control voltage according to an embodiment of the present invention. At step 602, a controlling module and an initializing module are initialized by a supply voltage and a ground voltage. At step 604, a first differential voltage is applied at a bulk terminal of a second transistor and at a gate terminal of an eighth transistor. At step 606, a second differential voltage is applied at a bulk terminal of a third transistor and at a gate terminal of a ninth transistor. At step 608, a common mode reference voltage is applied at a bulk terminal of a fourth transistor and at a gate terminal of a tenth transistor. At step 610, a bias current is applied at gate terminals of a first transistor and a seventh transistor. At step 612, an input terminal voltage is applied at gate terminals of the second transistor, the third transistor and the fourth transistor. At step 614, the common mode control voltage is generated.

The described embodiments of the present invention offer several advantages. First, the depletion characteristics allow zero, positive and even small negative values of the input common mode voltage to achieve desired currents. This will lead to larger input common mode ranges that could not otherwise be achieved at low power supply voltages. Second, there is no need of a compensation network for phase margin of CMFB loop, as the CMFB loop is of low gain.

Operational amplifiers including CMFB modules according to embodiments of the present invention may be utilized in a variety of different types of electronic circuits and systems, such as portable devices like cell phones and personal digital assistants (PDAs), as well as in computer systems, communications and control systems, and so on.

From the foregoing it will be appreciated that, although specific embodiments of the invention have been described herein for purposes of illustration, various modifications may be made without deviating from the spirit and scope of the invention.

We claim:

1. A low voltage continuous time common mode feedback module, comprising:
    an initializing module receiving a first differential input voltage and a second differential input voltage for providing a direct current bias; and
    a controlling module coupled to the initializing module and receiving the first differential input voltage and the second differential input voltages for controlling a common mode voltage, and wherein the controlling module includes a plurality of transistors, each of the transistors including a bulk node and at least some of the bulk nodes of the plurality of transistors receiving the first differential input voltage or the second differential input voltage.

2. A low voltage continuous time common mode feedback module comprising:
    an initializing module receiving a first differential input voltage and a second differential input voltage for providing a direct current bias;
    a controlling module receiving the first differential input voltage and the second differential input voltage for controlling a common mode voltage and wherein said controlling module comprises;
  a first transistor having a gate terminal for providing a bias current to the controlling module, a source terminal and a bulk terminal connected to a supply voltage and a drain terminal connected to a first node;
  a second transistor for receiving the first differential input voltage, having a source terminal connected to said first node, a bulk terminal receiving said first differential input voltage, a drain terminal connected to a second node and a gate terminal connected to an input terminal voltage;
  a third transistor for receiving the second differential input voltage, having a source terminal connected to said first node, a bulk terminal receiving said second differential input voltage, a drain terminal connected to said second node and a gate terminal connected to said input terminal voltage;
  a fourth transistor for receiving a common mode reference voltage, having a source terminal connected to said first node, a bulk terminal receiving said common mode reference voltage, a drain terminal connected to an output node and a gate terminal connected to said input terminal voltage;
  a fifth transistor for controlling a flow of current through said second and third transistors, said transistor having a source terminal and a bulk terminal connected to a ground voltage, a drain terminal connected to said second node and a gate terminal connected to a sixth node; and
  a sixth transistor for providing a common mode control voltage, having a source terminal and a bulk terminal connected to said ground voltage, a drain terminal connected to said output node, and a gate terminal connected to the gate terminal of said fifth transistor through said sixth node.

3. A low voltage continuous time common mode feedback module comprising:
  an initializing module receiving a first differential input voltage and a second differential input voltage for providing a direct current bias;
  a controlling module receiving the first differential input voltage and the second differential input voltage for controlling a common mode voltage; and
  wherein said initializing module comprises:
    a seventh transistor for providing said bias current to the initializing module, said transistor having a source terminal and a bulk terminal connected to said supply voltage, a drain terminal connected to a third node and a gate terminal receiving said bias current;
    an eighth transistor for receiving said first differential input voltage, said eight transistor having a source terminal connected to said third node, a bulk terminal connected to said supply voltage, a drain terminal connected to a fourth node and a gate terminal receiving said first differential input voltage;
    a ninth transistor for receiving said second differential input voltage, said ninth transistor having a source terminal connected to said third node, a bulk terminal connected to said supply voltage, a drain terminal connected to said fourth node and a gate terminal receiving said second differential input voltage;
    a tenth transistor for receiving said common mode reference voltage, said transistor having a source terminal connected to said third node, a bulk terminal connected to said supply voltage, a drain terminal connected to said output node and a gate terminal receiving said common mode reference voltage;
    an eleventh transistor for controlling a flow of current through said eighth transistor and said ninth transistor, said transistor having a source terminal and a bulk terminal connected to said ground voltage, a drain terminal connected to said fourth node and a gate terminal connected to a seventh node; and
    a twelfth transistor for providing said common mode control voltage, said transistor having a source terminal and a bulk terminal connected to said ground voltage, a drain terminal connected to said output node, and a gate terminal connected to the gate terminal of said eleventh transistor through said seventh node.

4. The module as claimed in claim 2, wherein said transistors comprises n-channel metal oxide semiconductor transistors and p-channel metal oxide semiconductor transistors.

5. The module as claimed in claim 3, wherein said transistors comprises n-channel metal oxide semiconductor transistors and p-channel metal oxide semiconductor transistors.

6. An operational amplifier comprising:
  one or more differential amplifier stages for generating differential output voltages; and
  a low voltage continuous time common mode feedback module operatively coupled to the one or more differential amplifier stages for receiving a first differential input voltage and a second differential input voltage to provide a common mode feedback voltage, the low voltage continuous time common mode feedback module comprising,
    an initializing module receiving a first differential input voltage and a second differential input voltage for providing a direct current bias; and
    a controlling module coupled to the initializing module and receiving the first differential input voltage and the second differential input voltages for controlling a common mode voltage, and wherein the controlling module includes a plurality of transistors, each of the transistors including a bulk node and at least some of the bulk nodes of the plurality of transistors receiving the first differential input voltage or the second differential input voltage.

7. A method for generating a common mode control voltage in a continuous time common mode feedback module comprising:
  initializing a controlling module and an initializing module by a supply voltage and a ground voltage;
  applying a first differential voltage at a bulk terminal of a second transistor and at a gate terminal of an eighth transistor;
  applying a second differential voltage at a bulk terminal of a third transistor and at a gate terminal of a ninth transistor;
  applying a common mode reference voltage at a bulk terminal of a fourth transistor and at a gate terminal of a tenth transistor;
  applying a bias current at gate terminals of a first transistor and a seventh transistor;
  applying an input terminal voltage at gate terminals of said second transistor, said third transistor and said fourth transistor; and
  generating the common mode control voltage.

8. An electronic system, comprising:
  electronic circuitry including at least one operational amplifier, at least one of the operational amplifiers including, at least one differential amplifier stage for generating a first differential output signal and a second differential output signal; and a common mode feedback module operatively coupled to each differential amplifier stage to receive the first differential output signal and second differential output signal and operable responsive to these signals to generate a common mode feedback signal that is applied to each differential amplifier stage to control a common mode voltage of the first and second differential output signals, each common mode feedback module comprising, an initializing module receiving a first differential input voltage and a second differential input voltage for providing a direct current bias; and a controlling module coupled to the initializing module and receiving the first differential input voltage and the second differential input voltages for controlling a common mode voltage, and wherein the controlling module includes a plurality of transistors, each of the transistors including a bulk node and at least some of the bulk nodes of the plurality of transistors receiving the first differential input voltage or the second differential input voltage.

9. The electronic system of claim 8 wherein the common mode feedback module comprises a continuous time common mode feedback module.

10. The electronic system of claim 8 wherein the common mode feedback module includes a controlling module receiving the first differential output signal and the second differential output signal, the controlling module comprising:

a first transistor having a gate terminal for providing a bias current to the controlling module, a source terminal and a bulk terminal connected to a supply voltage and a drain terminal connected to a first node;

a second transistor for receiving the first differential output voltage, having a source terminal connected to said first node, a bulk terminal receiving said first differential output voltage, a drain terminal connected to a second node and a gate terminal connected to an input terminal voltage;

a third transistor for receiving the second differential output voltage, having a source terminal connected to said first node, a bulk terminal receiving said second differential output voltage, a drain terminal connected to said second node and a gate terminal connected to said input terminal voltage;

a fourth transistor for receiving a common mode reference voltage, having a source terminal connected to said first node, a bulk terminal receiving said common mode reference voltage, a drain terminal connected to an output node and a gate terminal connected to said input terminal voltage;

a fifth transistor for controlling a flow of current through said second and third transistors, said transistor having a source terminal and a bulk terminal connected to a ground voltage, a drain terminal connected to said second node and a gate terminal connected to a sixth node; and a sixth transistor for providing a common mode control voltage, having a source terminal and a bulk terminal connected to said ground voltage, a drain terminal connected to said output node, and a gate terminal connected to the gate terminal of said fifth transistor through said sixth node.

11. The electronic system of claim 10 wherein the common mode feedback module further includes an initializing module receiving the first differential output signal and the second differential output signal, the initializing module comprising:

a seventh transistor for providing said bias current to the initializing module, said transistor having a source terminal and a bulk terminal connected to said supply voltage, a drain terminal connected to a third node and a gate terminal receiving said bias current;

an eighth transistor for receiving said first differential input voltage, said eight transistor having a source terminal connected to said third node, a bulk terminal connected to said supply voltage, a drain terminal connected to a fourth node and a gate terminal receiving said first differential input voltage;

a ninth transistor for receiving said second differential input voltage, said ninth transistor having a source terminal connected to said third node, a bulk terminal connected to said supply voltage, a drain terminal connected to said fourth node and a gate terminal receiving said second differential input voltage;

a tenth transistor for receiving said common mode reference voltage, said transistor having a source terminal connected to said third node, a bulk terminal connected to said supply voltage, a drain terminal connected to said output node and a gate terminal receiving said common mode reference voltage;

an eleventh transistor for controlling a flow of current through said eighth transistor and said ninth transistor, said transistor having a source terminal and a bulk terminal connected to said ground voltage, a drain terminal connected to said fourth node and a gate terminal connected to a seventh node; and a twelfth transistor for providing said common mode control voltage, said transistor having a source terminal and a bulk terminal connected to said ground voltage, a drain terminal connected to said output node, and a gate terminal connected to the gate terminal of said eleventh transistor through said seventh node.

12. The electronic system of claim 8 wherein at least some of the differential amplifier stages comprise:

a differential pair input stage that receives first and second input signals, the differential pair input stage having first and second ports;

first, second, and third transistors coupled in series between the first port and a reference voltage node, the first transistor receiving a first bias voltage on a control node and the second transistor receiving a second bias voltage on a control node, and a first output node on which the first differential output signal is developed being defined at the interconnection of the first and second transistors, and the third transistor receiving the common mode feedback signal on a control node; and fourth, fifth, and sixth transistors coupled in series between the second port and the reference voltage node, the fourth transistor receiving the first bias voltage on a control node and the fifth transistor receiving the second bias voltage on a control node, and a second output node on which the second differential output signal is developed being defined at the interconnection of the fourth and fifth transistors, and the sixth transistor receiving the common mode feedback signal on a control node.

13. The electronic system of claim 12 wherein at least some of the transistors are NMOS or PMOS transistors.

14. The electronic system of claim 8 further comprising a first transistor coupled between the first port and a reference voltage source and a second transistor coupled between the second port and the reference voltage source, each of the first and second transistors receiving a same voltage signal on a respective control node.

* * * * *

UNITED STATES PATENT AND TRADEMARK OFFICE
CERTIFICATE OF CORRECTION

PATENT NO. : 7,652,535 B2
APPLICATION NO. : 11/900929
DATED : January 26, 2010
INVENTOR(S) : Pratap N. Singh et al.

It is certified that error appears in the above-identified patent and that said Letters Patent is hereby corrected as shown below:

- In Claim 1, Column 8, Line 55, change "input voltages" to --input voltage--.

- In Claim 2, Column 8, Line 62, change "module comprising" to --module, comprising--.

- In Claim 2, Column 9, Line 2, change the semicolon after the word "comprises" to a colon.

- In Claim 3, Column 9, Line 38, change "module comprising" to --module, comprising--.

- In Claim 3, Column 9, Line 52, change "said eight transistor" to --said eighth transistor--.

- In Claim 4, Column 10, Line 17, change "comprises" to --comprise--.

- In Claim 5, Column 10, Line 20, change "comprises" to --comprise--.

- In Claim 6, Column 10, Line 22, change "amplifier comprising" to --amplifier, comprising--.

- In Claim 6, Column 10, Line 31, change the comma after the word "comprising" to a colon.

- In Claim 6, Column 10, Line 37, change "input voltages" to --input voltage--.

- In Claim 7, Column 10, Lines 45 and 46, change "module comprising" to --module, comprising--.

- In Claim 8, Column 11, Line 18, change "input voltages" to --input voltage--.

- In Claim 9, Column 11, Line 25, change "claim 8 wherein" to --claim 8, wherein--.

- In Claim 10, Column 11, Line 28, change "claim 8 wherein" to --claim 8, wherein--.

- In Claim 11, Column 11, Line 66, change "claim 10 wherein" to --claim 10, wherein--.

- In Claim 11, Column 12, Line 9, change "said eight transistor" to --said eighth transistor--.

- In Claim 12, Column 12, Line 39, change "claim 8 wherein" to --claim 8, wherein--.

- In Claim 13, Column 13, Line 3, change "claim 12 wherein" to --claim 12, wherein--.

- In Claim 14, Column 13, Line 5, change "claim 8 further comprising" to --claim 8, further comprising--.

Signed and Sealed this

Thirtieth Day of March, 2010

David J. Kappos
*Director of the United States Patent and Trademark Office*